United States Patent [19]
Aneha et al.

[11] Patent Number: 5,408,149
[45] Date of Patent: Apr. 18, 1995

[54] POWER CONTROL CIRCUIT FOR ELECTRONIC EQUIPMENT

[75] Inventors: Akira Aneha; Satoshi Inokoshi, both of Mobara, Japan

[73] Assignee: Futaba Denshi Kogyo K.K., Mobara, Japan

[21] Appl. No.: 157,290

[22] Filed: Nov. 26, 1993

[30] Foreign Application Priority Data

Nov. 27, 1992 [JP] Japan ............... 4-087206 U

[51] Int. Cl.6 ........................................... H03K 3/01
[52] U.S. Cl. .................... 327/544; 327/393; 327/427
[58] Field of Search ............ 307/571, 296.1, 296.3, 307/296.4, 296.5, 296.8, 272.3, 592, 572, 573, 597; 365/227

[56] References Cited

U.S. PATENT DOCUMENTS

| | | | |
|---|---|---|---|
| 3,535,560 | 10/1970 | Cliff | 307/296.3 |
| 3,559,072 | 1/1971 | Davisson | 307/597 |
| 4,234,920 | 11/1980 | Van Ness et al. | 307/296.4 |
| 4,538,074 | 8/1985 | Fraden | 307/597 |
| 4,614,880 | 9/1986 | Go et al. | 307/592 |
| 4,631,418 | 12/1986 | Toyomura | 307/296.3 |
| 4,644,182 | 2/1987 | Kawashima et al. | 307/571 |
| 5,140,183 | 8/1992 | Takenaka | 307/296.1 |
| 5,251,179 | 10/1993 | Wittman | 365/227 |

*Primary Examiner*—Timothy P. Callahan
*Assistant Examiner*—T. T. Lam
*Attorney, Agent, or Firm*—Oblon, Spivak, McClelland, Maier, & Neustadt

[57] ABSTRACT

A power control circuit for an electronic equipment capable of turning off a power switch to prevent useless consumption of a power supply battery when non-operation of an electronic equipment over a predetermined period of time is detected. A counter circuit 25 is reset when a power switch is turned on, so that a main switch is turned on to render an electronic equipment operative. When a signal is generated from a logical circuit detecting auto cut-off conditions, a clock signal is fed from a control circuit to the counter circuit, so that the main switch is turned off by a carryover signal. After the auto cut-off conditions are detected, a predetermined number of clock pulses are counted to cause the main switch to be turned off, to thereby prevent malfunction of the electronic equipment due to incidental introduction of noise thereinto.

2 Claims, 2 Drawing Sheets

FIG. 2A ON/OFF
FIG. 2B SM
FIG. 2C C
FIG. 2D AC
FIG. 2E CKL Φ
FIG. 2F COUNTED VALUE M
FIG. 2G OUTPUT VOLTAGE

FIG. 3 (PRIOR ART)
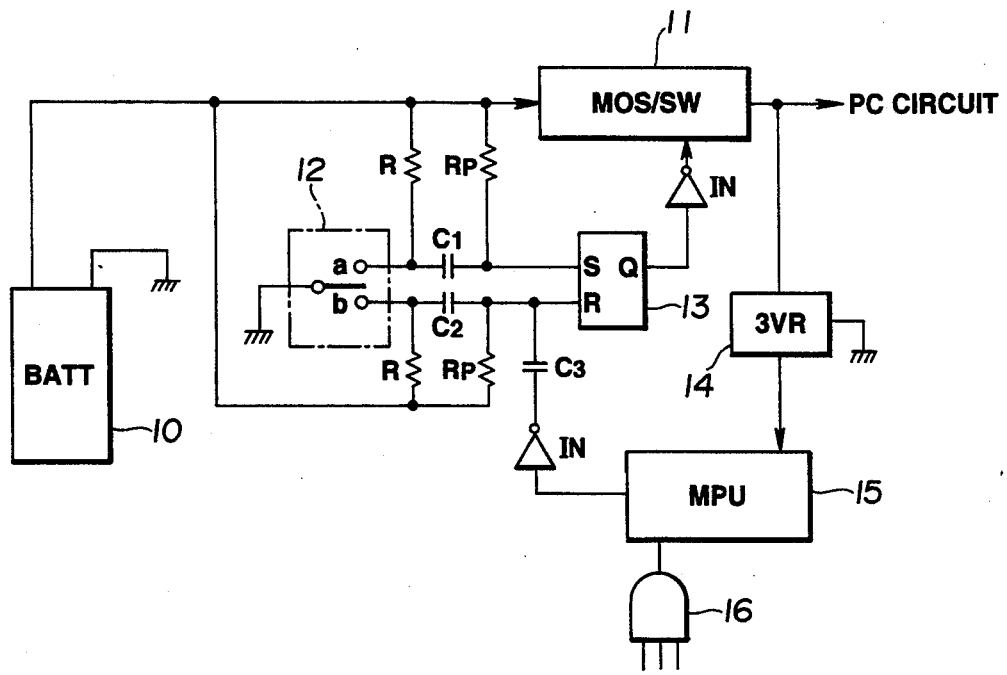
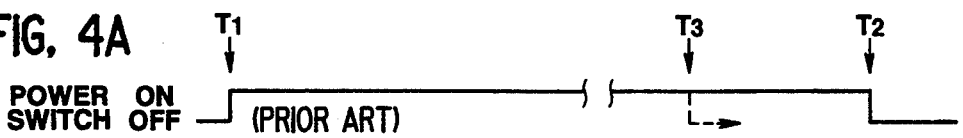
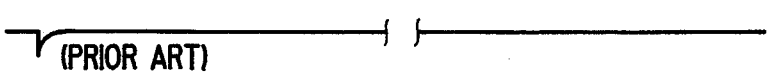
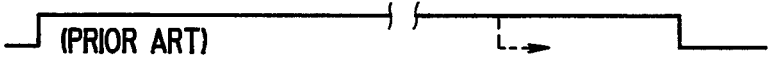
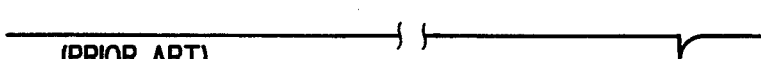
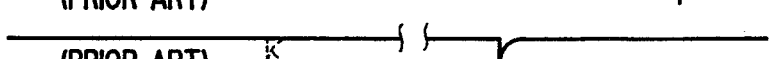
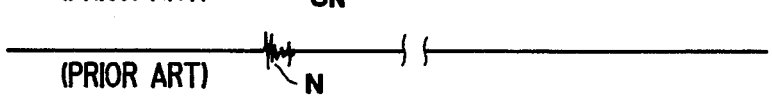

POWER CONTROL CIRCUIT FOR ELECTRONIC EQUIPMENT

BACKGROUND OF THE INVENTION

This invention relates to an electronic device which is adapted to exhibit a function of automatically shutting off a power voltage, and more particularly to a power control circuit useful for a portable electronic device driven by a battery.

A portable or down-sized electronic device typically uses a rechargeable battery such as, for example, a nickel-cadmium battery or a conventional primary battery as a drive power supply therefor. Unfortunately, the battery fails to exhibit serviceability over an increased period of time because a power feed capacity thereof is substantially restricted.

In view of the foregoing, such a battery powered type electronic device as described above often includes a power control circuit which permits a power switch to be automatically turned off when an operation input is not carried out for a predetermined period of time, to thereby effectively prevent the battery from being subject to useless or wasteful power consumption.

Such a power control circuit is generally constructed in such a manner as shown in FIG. 3.

More particularly, the conventional power control circuit includes a battery or a secondary battery 10 which acts to feed an electronic device with a power supply voltage. The battery 10 is connected through a main switch 11 to various kinds of function circuits and control circuits to feed the circuits with an output of the battery.

Reference numeral 12 designates a power switch of the electronic device, which includes an on-contact a and an off-contact b which are selectively operated by means of a manually movable element. The on-contact a and off-contact b are connected through capacitors C1 and C2 to an S terminal of a flip-flop circuit 13 and an R terminal thereof, respectively, so that a Q output of the flip-flop circuit 13 is fed through an inverter IN to the above-described main switch 11, resulting in operation of the main switch 11 being carried out.

Reference numeral 14 designates a three-terminal voltage regulator, of which an output voltage causes the power supply voltage to be fed to a control circuit 15.

The control circuit 15 is provided with a logical circuit 16 for detecting cut-off conditions of the electronic device, so that, for example, when specific operation input is carried out over a predetermined period of time, the main switch 11 is automatically turned off in accordance with a judgment of the control circuit 15 which monitors an output of the logical circuit 15.

Thus, in the conventional power control circuit, when the movable element of the power supply switch 12 is moved to a side of the on-contact a as indicated by wave forms shown in FIG. 4, the S terminal of the flip-flop circuit 13 is fed with a negative trigger signal $S_1$ through the capacitor C1 at time $T_1$, so that the Q output of the flip-flop circuit 13 is inverted, resulting in the main switch 11 being turned on. This causes a power of the battery 10 to be fed through the thus turned on main switch 11 to the electronic device, resulting in the device being driven for various operations.

Also, when the movable element of the power switch 12 is changed over to a side of the off-contact b at time $T_2$, a negative trigger signal $S_2$ is fed through the capacitor C2 to the R contact of the flip-flop circuit 13, so that an inverted Q output of the flip-flop circuit 13 causes the main switch 11 to be turned off.

In FIG. 3, reference character R designates a resistor which comprises a pull-up resistor and $R_p$ is a resistor for setting a time constant of each of the trigger signals.

Then, when operation of the electronic equipment is not carried out over a predetermined period of time while the power supply is kept turned on, an auto cut-off signal generated from the logical circuit 16 detecting cut-off conditions is fed to the control circuit 15 at time $T_3$, so that the control circuit 15 outputs a signal indicating an L level through the inverter IN. The signal thus output is subject to differentiation in the capacitor C3, so that a negative trigger signal $S_3$ is fed to the R terminal of the flip-flop circuit 13.

Thus, it will be noted that the conventional power control circuit is so constructed that when non-operation of the electronic device continues over a predetermined period of time, the power supply is automatically turned off, to thereby eliminate useless power consumption, as well as wasteful power consumption due to a failure in or neglect of turning-off of the power switch 12 or the like.

Unfortunately, the conventional power control circuit causes a serious problem when it is applied to an electronic device which tends to cause significant malfunctions when a power supply voltage is shut off.

For example, when the conventional power control circuit is incorporated in an electronic device such as a radio control device which is adapted to operate a vehicle, an airplane or the like by radio control, environmental noise N generated in an operational environment shown in FIG. 4 such as, particularly, static electricity is introduced through a human body, an antenna or an operational switch into the electronic equipment. When the noise N is applied to the R terminal of the flip-flop circuit such a negative trigger signal $S_N$ as indicated at dotted lines in FIG. 4 causes the power supply to be turned off, resulting in the device being uncontrolled.

SUMMARY OF THE INVENTION

The present invention has been made in view of the foregoing disadvantage of the prior art.

Accordingly, it is an object of the present invention to provide a power control circuit for an electronic device which is capable of effectively confirming or detecting non-operation or auto cut-off conditions of an electronic device.

It is another object of the present invention to provide a power control circuit for an electronic device which is capable of being adequately controlled even in an environment which substantially produces noise due to an interference magnetic field, static electricity or the like.

In accordance with the present invention, a power control circuit for an electronic device is provided. The power control circuit includes a main switch for feeding power to various function circuits and control circuits incorporated therein, a power switch connected in parallel to the main switch and manually operated, a counter circuit reset to a predetermined value by on-operation of the power switch, and a control circuit for providing the counter circuit with a clock signal when the electronic device satisfies cut-off conditions, wherein the main switch is caused to open by an output of the counter circuit obtained when a counted value of the counter circuit reaches a predetermined value.

In the present invention, as described above, the control circuit for carrying out auto cut-off is provided with the counter circuit, which acts to count pulses over a predetermined period of time to confirm or detect non-operation of the electronic device (auto cut-off conditions). Thus, the power control circuit of the present invention appropriately controls the power circuit even in an environment which causes frequent generation of noise due to an interference magnetic field, static electricity or the like.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein:

FIGS. 2A-2G are wave form chart showing signals generated at parts of the power control circuit of FIG. 1 during on-off operation of a power supply;

FIG. 3 is a block diagram showing a conventional power control circuit for an electronic device; and FIGS. 4A-4F are a wave form chart showing a control signal generated from the power control circuit of FIG. 3.

DETAILED DESCRIPTION OF THE PREFERRED EMBODIMENT

Figure 1:
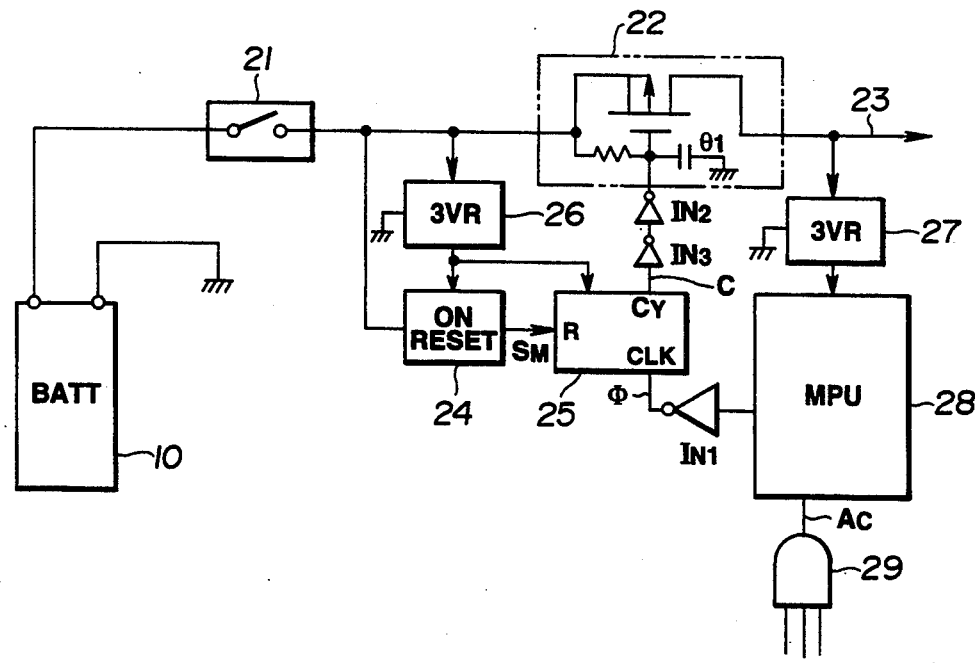
FIG. 1 is a block diagram showing an embodiment of a power control circuit for an electronic device according to the present invention.

Now, a power control circuit for an electronic device according to the present invention will be described hereinafter with reference to FIGS. 1 and 2A-2G.

Referring now to FIG. 1, an embodiment of a power control circuit for an electronic device according to the present invention is illustrated. A power control circuit of the illustrated embodiment which is applied to an electronic device for radio control or a remote control device.

In FIG. 1, reference numeral 10 designates a power supply pack adapted to be externally attached to the electronic device. The power supply pack 10 may comprise, for example, a rechargeable nickel-cadmium battery means.

A voltage of the power supply pack 10 is fed through a power switch 21 of the electronic device to the equipment. The power switch 21 is connected to function circuits provided in the electronic device through a main switch 22 electronically on-off controlled and a power line 23.

Reference numeral 24 designates a power on-reset circuit to which a voltage is fed from a regulator 26. The on-reset circuit 24 may comprise, for example, a monostable multivibrator. Reference numeral 25 is a counter circuit which is adapted to be reset by the power on-reset circuit 24.

The counter circuit 25 generates a carryover output C in the form of a signal for on-off control of the main switch 22 and has a clock terminal CLK to which a clock signal generated by a control circuit 28 is fed through an inverter $IN_1$.

The control circuit 28 is constituted by a microprocessor for operating the electronic device and fed with a drive power from a three-terminal voltage regulator 27.

Reference numeral 29 designates a logical circuit which functions to detect auto cut-off conditions used for confirming or detecting at least non-operation of the electronic device over a predetermined period of time. An input signal of the logical circuit 29 serves as any drive signal depending on the electronic device.

Now, the manner of operation of the power control circuit of the illustrated embodiment constructed as described above will be described hereinafter with reference to FIGS. 2A-2G.

When the power switch 21 is turned on at the time $T_1$, a voltage is applied from the regulator 26 to the power on-reset circuit 24 and counter circuit 25, resulting in the circuits 24 and 25 being rendered active. The power on-reset circuit 24 generates such a signal $S_M$ falling in a predetermined period of time as shown in FIG. 2A to reset the counter circuit 25, so that it generates a carryover signal C of a negative level, which is output from the output terminal of the circuit 25. The carryover signal C thus generated is applied through the inverters $IN_2$ and $IN_3$ to a gate voltage across a switching element Q of the main switch 22, to thereby cause it to turn on.

A voltage applied to the power line 23 acts to drive the electronic device and also acts to drive the control circuit 28 through the three-terminal regulator 27.

When the power switch 21 is turned off, all power supplies arranged in the electronic devices are isolated from the power supply pack 10.

When an operator forgets or neglects to turn off a power supply of the radio control device, a signal AC which indicates auto cut-off conditions is fed from the logical circuit 29 to the control circuit, for example, at the time $T_2$. When the control circuit 28 receives the signal, it immediately starts to feed a clock signal $\Phi$ through the inverter $IN_1$ to the counter circuit 25, so that a value M counted by the counter circuit 25 may be increased as shown in FIG. 2F. When the counted value M reaches a predetermined value P, the carryover signal C is inverted and then acts to turn off the main switch 22 through the inverters $IN_2$ and $IN_3$.

In connection with the counted value P which is subject to carryover by counting of a clock, it is merely required to carry out time setting which prevents malfunction from occurring due to electrostatic noise N externally incidentally introduced into the device as shown in FIG. 4. For this purpose, as the clock signal fed to the counter circuit 25, the above-described clock signal $\Phi$ of the control circuit 28 may be used in its original form.

As described above, the illustrated embodiment is so constructed that the counter circuit 25 is reset through the on-operation of the power switch 21. Alternatively, the embodiment may be constructed in such a manner that the on-operation of the power switch 21 causes a predetermined numerical value to be loaded in the counter circuit 25, to thereby turn on the main switch 22 and reduce the numerical value of the counter circuit 25 by a clock signal fed thereto from the circuit control when the auto cut-off conditions are established. Also, the embodiment may be so constructed that the main switch 22 is turned off when an output of the counter circuit reaches "0".

As can be seen from the foregoing, the power control device for an electronic device according to the present invention includes the means which permits the electronic device to detect the auto cut-off conditions and the counter circuit starts counting accordance with an output of the means as a result of the detection, wherein the main switch of the electronic device is turned off when a counted value of the counter circuit reaches a predetermined numerical value. Such construction of the present invention prevents the power supply of the electronic device from being turned off by noise externally introduced thereinto even when the electronic device is operated in a noisy environment.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A power control circuit or an electronic device comprising:

a main switch for controlling the output of power to a plurality of function circuits and control circuits incorporated therein;

a manually operated power switch connected between a power supply and said main switch;

a counter circuit which is reset to a predetermined value by an on-operation of a power on reset connected to said power switch;

a logic circuit connected to a control circuit, for detecting cut-off conditions of the electronic device; and said control circuit for providing said counter circuit with a clock signal when the electronic device satisfies said cut-off conditions;

said main switch being caused to open in response to an output of said counter circuit obtained when a counted value of said counter circuit reaches a predetermined value.

2. The power control circuit as defined in claim 1, wherein said cut-off conditions are established when power is not supplied to the electronic device for a predetermined period of time.

* * * * *